United States Patent
Rick et al.

(10) Patent No.: US 8,295,371 B2
(45) Date of Patent: *Oct. 23, 2012

(54) MULTI-CARRIER RECEIVER FOR WIRELESS COMMUNICATION

(75) Inventors: Roland Reinhard Rick, Superior, CO (US); Vladislav Sorokine, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 886 days.

This patent is subject to a terminal disclaimer.

(21) Appl. No.: 11/777,244

(22) Filed: Jul. 12, 2007

(65) Prior Publication Data

US 2008/0013654 A1    Jan. 17, 2008

Related U.S. Application Data

(60) Provisional application No. 60/830,923, filed on Jul. 14, 2006.

(51) Int. Cl.
*H04L 27/28* (2006.01)
(52) U.S. Cl. ......... 375/260; 375/316; 375/319; 375/345
(58) Field of Classification Search .................. 375/260, 375/316, 319, 345; 714/786, 794, 795; 370/69.1; 455/59

See application file for complete search history.

(56) References Cited

U.S. PATENT DOCUMENTS

| | | | | |
|---|---|---|---|---|
| 5,852,630 | A * | 12/1998 | Langberg et al. | 375/219 |
| 5,951,629 | A * | 9/1999 | Wertheim et al. | 708/517 |
| 6,002,925 | A * | 12/1999 | Vu et al. | 455/313 |
| 6,005,506 | A | 12/1999 | Bazarjani et al. | |
| 6,243,430 | B1 | 6/2001 | Mathe | |
| 6,445,736 | B1 | 9/2002 | Wheeler | |
| 6,480,528 | B1 | 11/2002 | Patel et al. | |
| 6,700,919 | B1 * | 3/2004 | Papasakellariou | 375/130 |
| 6,880,262 | B1 * | 4/2005 | Jensen | 341/155 |

(Continued)

FOREIGN PATENT DOCUMENTS

CN    1300467    6/2001

(Continued)

OTHER PUBLICATIONS

International Search Report—PCT/US07/073546, International Search Authority—European Patent Office—May 30, 2008.

(Continued)

*Primary Examiner* — Shuwang Liu
*Assistant Examiner* — Helene Tayong
(74) *Attorney, Agent, or Firm* — Jonathan Velasco; Abdollah Katbab

(57) ABSTRACT

A multi-carrier receiver capable of receiving one or multiple frequency channels simultaneously is described. In one design, the multi-carrier receiver includes a single radio frequency (RF) receive chain, an analog-to-digital converter (ADC), and at least one processor. The RF receive chain processes a received RF signal and provides an analog baseband signal comprising multiple signals on multiple frequency channels. The ADC digitizes the analog baseband signal. The processor(s) digitally processes the samples from the ADC to obtain an input sample stream. This digital processing may include digital filtering, DC offset cancellation, I/Q mismatch compensation, coarse scaling, etc. The processor(s) digitally downconverts the input sample stream for each frequency channel to obtain a downconverted sample stream for that frequency channel. The processor(s) then digitally processes each downconverted sample stream to obtain a corresponding output sample stream. This digital processing may include digital filtering, downsampling, equalization filtering, upsampling, sample rate conversion, fine scaling, etc.

44 Claims, 9 Drawing Sheets

U.S. PATENT DOCUMENTS

| | | | |
|---|---|---|---|
| 6,907,235 B2 | 6/2005 | Lisenbee | |
| 7,151,473 B2 * | 12/2006 | Fontaine et al. | 341/139 |
| 7,162,218 B2 | 1/2007 | Axness et al. | |
| 7,361,188 B2 * | 4/2008 | Barr | 600/509 |
| 7,809,353 B2 * | 10/2010 | Brown et al. | 455/410 |
| 2002/0160734 A1 * | 10/2002 | Li et al. | 455/245.1 |
| 2005/0059360 A1 * | 3/2005 | Kenington | 455/91 |
| 2005/0272400 A1 * | 12/2005 | Chen et al. | 455/337 |
| 2006/0291428 A1 * | 12/2006 | Filipovic | 370/335 |
| 2007/0099570 A1 * | 5/2007 | Gao et al. | 455/63.1 |

FOREIGN PATENT DOCUMENTS

| | | |
|---|---|---|
| CN | 1518309 A | 8/2004 |
| CN | 1168257 | 9/2004 |
| CN | 1178401 | 12/2004 |
| CN | 1599266 A | 3/2005 |
| CN | 1706109 A | 12/2005 |
| CN | 1719818 A | 1/2006 |
| EP | 1517501 | 3/2005 |
| GB | 2328353 | 2/1999 |
| JP | 11146023 A | 5/1999 |
| JP | 2001274759 A | 10/2001 |
| JP | 2001526487 | 12/2001 |
| JP | 2005529544 | 9/2005 |
| JP | 2006509438 A | 3/2006 |
| KR | 20010032840 | 4/2001 |
| WO | 9930428 | 6/1999 |
| WO | 0077971 | 12/2000 |
| WO | 02060114 | 8/2002 |
| WO | WO03105390 | 12/2003 |
| WO | WO2004054194 A1 | 6/2004 |
| WO | 2005048552 | 5/2005 |
| WO | WO2006038085 | 4/2006 |

OTHER PUBLICATIONS

Written Opinion—PCT/US07/073546, International Search Authority—European Patent Office—May 30, 2008.

Nahm, S. et al., "A Cordic-based Digital Quadrature Mixer: comparison with a ROM-based architecture" Circuits and Systems, 1998. ISCAS 1998 Proceedings of the 1998 IEEE International Symposium on Monterey, CA USA, May 31-Jun. 3, 1998, New York, NY, USA, IEEE, US, vol. 4, May 31, 1998, pp. 385-388.

Lohning, M., et al: "Digital Down Conversion in Software Radio Terminals," European Signal Processing Conference, Eusipco 2000, pp. 1-4, Sep. 4-8, 2000.

Gisuthan, et al: "Pipelining Flat Cordic baed Trigonometric Function Generators," Microelectronics Journal, Mackintosh Publications, LTD., Luton, GB, vol. 33, No. 1-2, Jan. 2, 2002, pp. 77-89.

Hentschel, et al., "The Digital Front-End of Software Radio Terminals," IEEE Personal Communications, IEEE Communications Society, US, vol. 6, No. 4, Aug. 1, 1998, pp. 40-46.

* cited by examiner

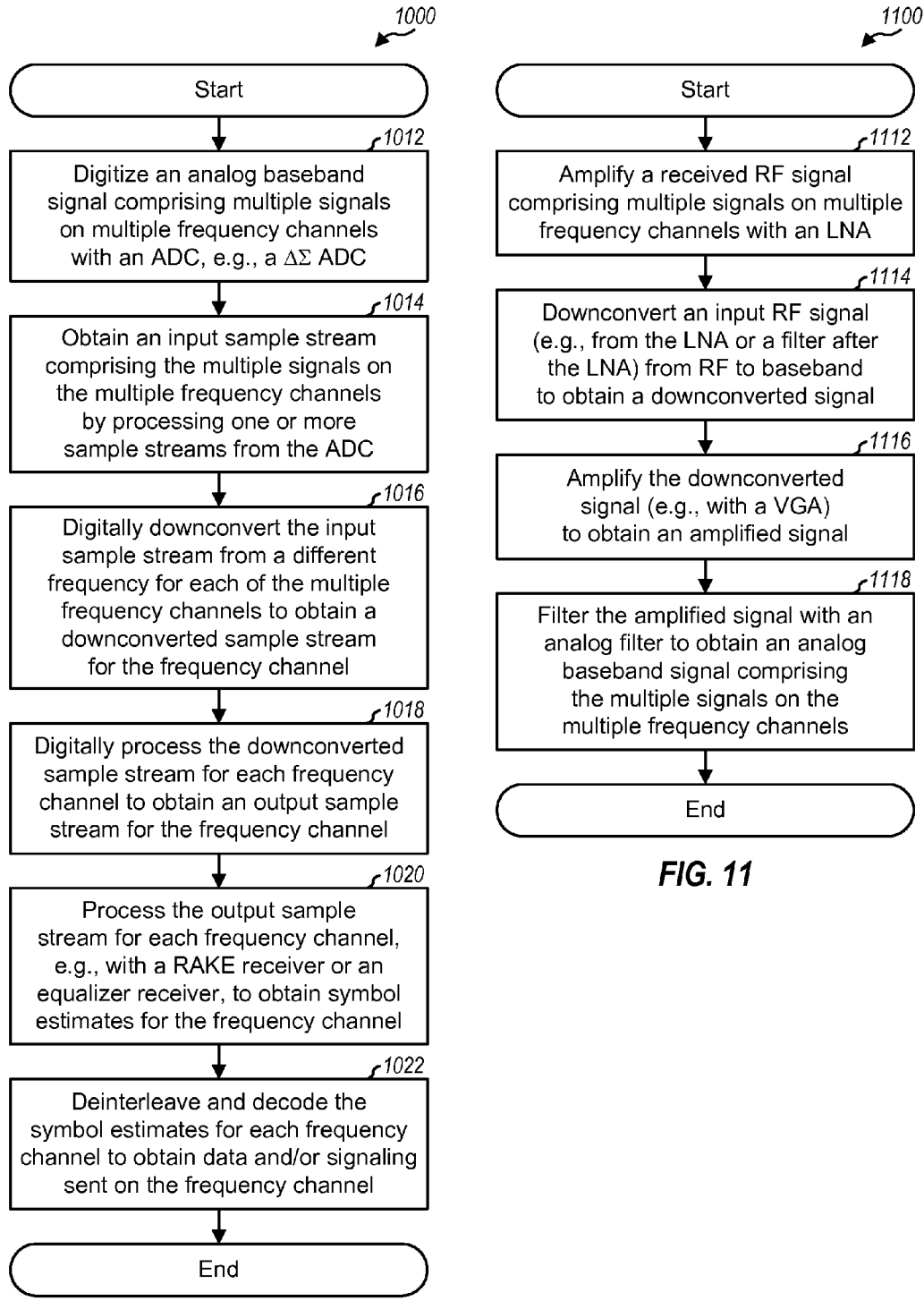

MULTI-CARRIER RECEIVER FOR WIRELESS COMMUNICATION

RELATED APPLICATION

The present application for patent claims priority to Provisional Application Ser. No. 60/830,923, entitled "DEMODULATION OF MULTIPLE DATA CHANNELS WITH A SINGLE RF RECEIVE CHAIN," filed Jul. 14, 2006, assigned to the assignee hereof, and expressly incorporated herein by reference.

TECHNICAL FIELD

The present disclosure relates generally to communication, and more specifically to a receiver for a wireless communication system.

BACKGROUND

Wireless communication systems are widely deployed to provide various communication services such as voice, video, packet data, messaging, broadcast, etc. These systems may be multiple-access systems capable of supporting multiple users by sharing the available system resources. Examples of such multiple-access systems include Code Division Multiple Access (CDMA) systems, Time Division Multiple Access (TDMA) systems, Frequency Division Multiple Access (FDMA) systems, Orthogonal FDMA (OFDMA) systems, and Single-Carrier FDMA (SC-FDMA) systems.

Data usage for wireless communication systems continually grows due to increasing number of users as well as emergence of new applications with higher data requirements. A system may support a particular maximum data rate on one frequency channel under favorable channel conditions. This maximum data rate is typically determined by system design. To increase capacity, the system may utilize multiple frequency channels for transmission. However, the design complexity and cost of a receiver may increase substantially in order to support reception of multiple frequency channels.

There is therefore a need in the art for a cost effective receiver that can support reception of multiple frequency channels.

SUMMARY

A multi-carrier receiver capable of receiving one or multiple frequency channels simultaneously using a single radio frequency (RF) receive chain is described herein. The single RF receive chain may be wideband and designed for a particular maximum number of (T) frequency channels. Up to T signals may be received simultaneously from up to T frequency channels using this single RF receive chain.

In one design, the multi-carrier receiver includes one RF receive chain, an analog-to-digital converter (ADC), and at least one processor. The RF receive chain may process (e.g., amplify, downconvert, and analog filter) a received RF signal and provide an analog baseband signal comprising multiple signals on multiple frequency channels. The ADC may digitize the analog baseband signal and provide one or more sample streams. The processor(s) may digitally process the one or more sample streams from the ADC to obtain an input sample stream comprising the multiple signals on the multiple frequency channels. This digital processing may include digital filtering, direct current (DC) offset cancellation, inphase/quadrature (I/Q) mismatch compensation, coarse scaling, etc. The processor(s) may then digitally downconvert the input sample stream for each frequency channel to obtain a downconverted sample stream for that frequency channel. The digital downconversion frequency for each frequency channel may be determined based on a calculated center frequency and an estimated frequency error for that frequency channel. The processor(s) may further digitally process the downconverted sample stream for each frequency channel to obtain an output sample stream for that frequency channel. This digital processing may include digital filtering, downsampling, equalization filtering, upsampling, sample rate conversion, fine scaling, DC offset cancellation, etc. The various types of digital processing is described below. Coarse automatic gain control (AGC) may be performed for the input sample stream for all frequency channels, e.g., by adjust the gains of analog circuit blocks within the RF receive chain. Fine AGC may be performed independently for the output sample stream for each frequency channel. This may allow for reception of multiple signals with different received power levels.

Various aspects and features of the disclosure are described in further detail below.

BRIEF DESCRIPTION OF THE DRAWINGS

FIG. 10 shows a process for receiving signals from multiple frequency channels.
FIG. 11 shows a process performed by an RF receive chain.

DETAILED DESCRIPTION

The multi-carrier receiver described herein may be used for various wireless communication systems such as CDMA, TDMA, FDMA, OFDMA, and SC-FDMA systems. The terms "system" and "network" are often used interchangeably. A CDMA system may implement a radio technology such as cdma2000, Universal Terrestrial Radio Access (UTRA), etc. cdma2000 covers IS-2000, IS-95, and IS-856 standards. UTRA includes Wideband-CDMA (W-CDMA) and Low Chip Rate (LCR). A TDMA system may implement a radio technology such as Global System for Mobile Communications (GSM). An OFDMA system may implement a radio technology such as Evolved UTRA (E-UTRA), IEEE 802.11, IEEE 802.16, IEEE 802.20, Flash-OFDM™, etc. These various radio technologies and standards are known in the art. UTRA, E-UTRA, and GSM are described in documents from an organization named "3rd Generation Partnership Project" (3GPP). cdma2000 is described in documents from an organization named "3rd Generation Partnership Project 2" (3GPP2). 3GPP and 3GPP2 documents are publicly available.

For clarity, certain aspects of the multi-carrier receiver are described for an HRPD system that implements IS-856. HRPD is also referred to as CDMA2000 1xEV-DO (Evolution-Data Optimized), 1xEV-DO, 1x-DO, DO, High Data Rate (HDR), etc. The terms "HRPD", "EV-DO", and "DO" are often used interchangeably. HRPD is described in 3GPP2 C.S0024-B, entitled "cdma2000 High Rate Packet Data Air Interface Specification," dated March 2007, which is publicly available. For clarity, HRPD terminology is used in much of the description below.

The multi-carrier receiver described herein may be used for an access terminal as well as an access point. An access point is generally a fixed station that communicates with the access terminals and may also be referred to as a base station, a Node B, etc. An access terminal may be stationary or mobile and may also be referred to as a mobile station, a user equipment (UE), a mobile equipment, a terminal, a subscriber unit, a station, etc. An access terminal may be a cellular phone, a personal digital assistant (PDA), a handset, a wireless communication device, a handheld device, a wireless modem, a laptop computer, etc. For clarity, the use of the multi-carrier receiver for an access terminal is described below.

The multi-carrier receiver can receive one or multiple CDMA signals simultaneously. Each CDMA signal may be transmitted on a different CDMA channel. A CDMA channel is a frequency channel for one CDMA signal and is 1.2288 MHz wide in HRPD. A CDMA channel is also commonly referred to as a carrier.

Figure 1:
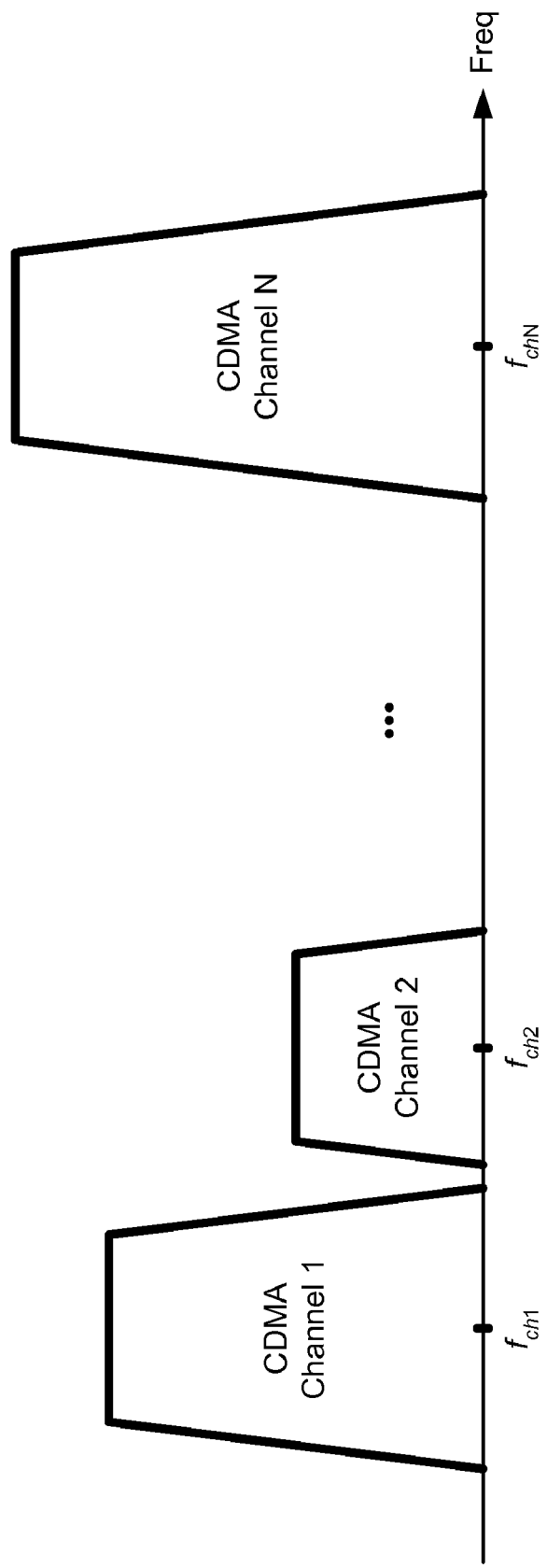
FIG. 1 shows CDMA signals on multiple CDMA channels.

FIG. 1 shows an example transmission of N CDMA signals on N CDMA channels, where $N \geq 1$ in general and $N>1$ for multi-carrier operation. In this example, CDMA channel 1 has a carrier frequency of $f_{ch1}$, CDMA channel 2 has a carrier frequency of $f_{ch2}$, and so on, and CDMA channel N has a carrier frequency of $f_{chN}$. The carrier frequencies are typically selected such that the CDMA channels are spaced sufficiently far apart to reduce inter-channel interference. In general, the carrier frequencies of the N CDMA channels may or may not be related to one another. The carrier frequency of each CDMA channel may be selected independently subject to a minimum inter-channel spacing criterion. The carrier frequencies may be evenly spaced across frequency and separated by a fixed frequency spacing of $f_{spacing}$, which may be 1.2288 MHz or some larger value. The N CDMA signals may carry any type of data for any service such as voice, video, packet data, text messaging, etc. The N CDMA signals may be received from one or multiple access points and may be received at different power levels (as shown in FIG. 1) or at the same power level.

It is desirable to support reception of one or multiple CDMA channels using as little circuitry as possible in order to reduce cost, lower power consumption, improve reliability, and obtain other benefits. T different RF receive chains may be used to receive up to T CDMA signals from up to T CDMA channels, where T is the maximum number of CDMA signals that can be received simultaneously. However, the T RF receive chains may significantly increase the cost of an access terminal.

In an aspect, the multi-carrier receiver employs a single RF receive chain to support simultaneous reception of up to T CDMA signals from up to T different CDMA channels. The single RF receive chain may be wideband and designed for T adjacent CDMA channels, where T may be any suitable value. N CDMA signals may be received with this single RF receive chain, where N may be up to T. The multi-carrier receiver may be both power efficient and cost effective due to the use of a single RF receive chain.

Figure 2:
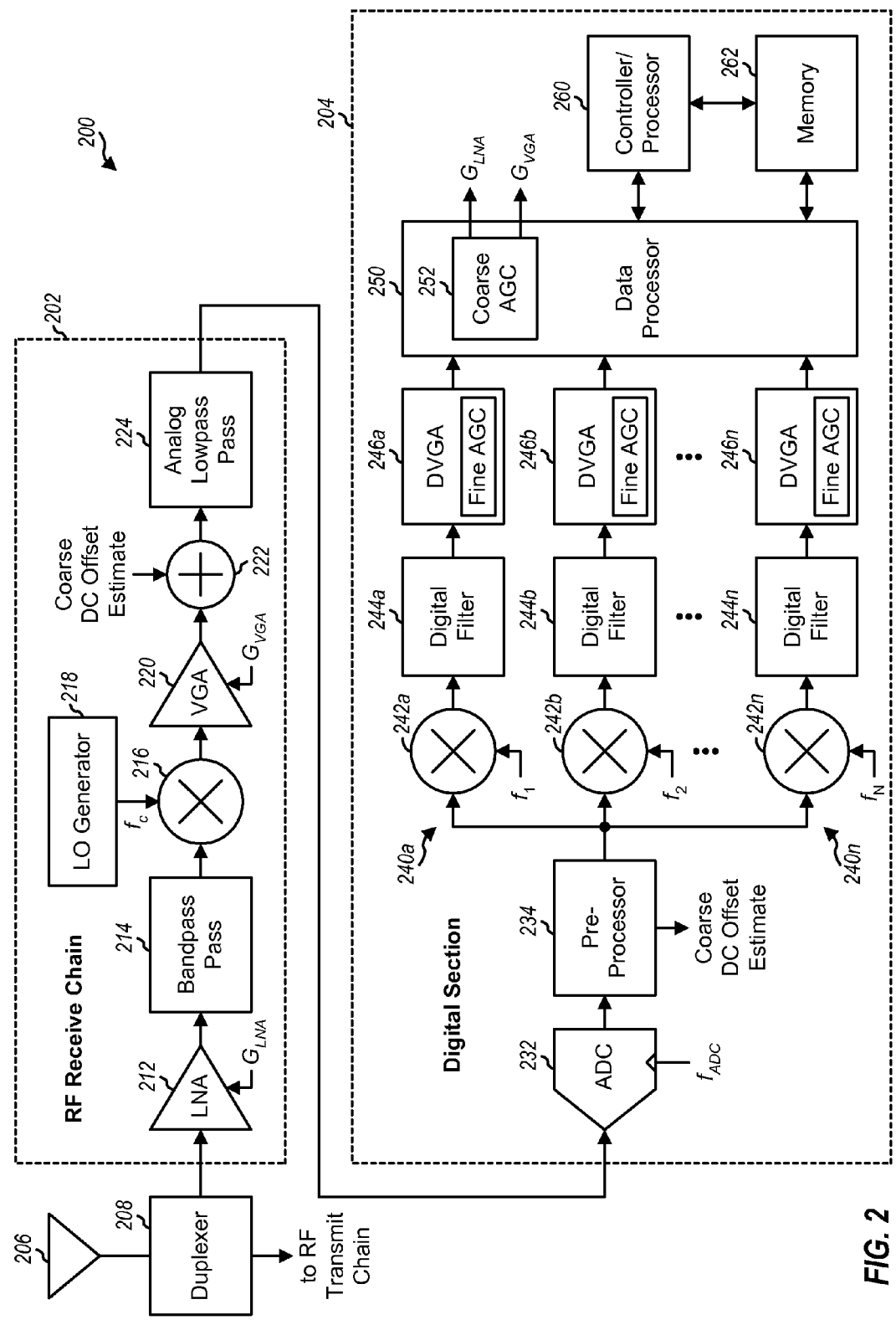
FIG. 2 shows a block diagram of a multi-carrier receiver.

FIG. 2 shows a block diagram of a design of a multi-carrier receiver 200, which may be used for an access terminal. Multi-carrier receiver 200 includes an RF receive chain 202 and a digital section 204. An antenna 206 may receive forward link signals from one or more access points. A duplexer 208 may filter the RF signal from antenna 206 for a desired forward link frequency band and provide a received RF signal to RF receive chain 202.

An RF receive chain may implement a super-heterodyne architecture or a direct-conversion architecture. In the super-heterodyne architecture, a received RF signal is frequency downconverted in multiple stages, e.g., from RF to an intermediate frequency (IF) in one stage, and then from IF to baseband in another stage. In the direct-conversion architecture, which is also referred to as a zero-IF architecture, the received RF signal is frequency downconverted from RF directly to baseband in one stage. The super-heterodyne and direct-conversion architectures may use different circuit blocks and/or have different circuit requirements. The following description assumes the use of the direct-conversion architecture.

Within RF receive chain 202, a low noise amplifier (LNA) 212 may receive and amplify the received RF signal with a gain $G_{LNA}$ and provide an amplified RF signal. A bandpass filter 214 may filter the signal from LNA 212 to remove out-of-band signal components and provide an input RF signal. Bandpass filter 214 may be a surface acoustic wave (SAW) filter, a ceramic filter, or some other type of filter. A mixer 216 may frequency downconvert the input RF signal from RF to baseband with an analog local oscillator (LO) signal from an LO generator 218. LO generator 218 may include a voltage controlled oscillator (VCO), a phase locked loop (PLL), a reference oscillator, etc. A variable gain amplifier (VGA) 220 may amplify the downconverted signal from mixer 216 with a gain $G_{VGA}$. A summer 222 may remove DC offset in the amplified signal from VGA 220. An analog lowpass filter 224 may filter the signal from VGA 220 and provide an analog baseband signal to digital section 204.

Within digital section 204, an ADC 232 may digitize the analog baseband signal at a sampling rate of $f_{ADC}$ and provide one or more sample streams. The ADC sampling rate may be fixed and selected based on the maximum number of CDMA channels that can be received simultaneously. Alternatively, the ADC sampling rate may be configurable and selected based on the number of CDMA channels being received. A pre-processor 234 may perform pre-processing on the one or more sample streams from ADC 232 and provide an input sample stream at a sample rate of $f_{sample}$ to N digital processing chains 240a through 240n for N CDMA channels. The input sample rate $f_{sample}$ may be related to the ADC sampling rate $f_{ADC}$ by an integer or non-integer factor.

In the design shown in FIG. 2, each digital processing chain 240 includes a rotator 242, a digital filter 244, and a DVGA 246. Within digital processing chain 240 for CDMA channel n, rotator 242 may operate as a digital downconverter, frequency downconvert the input sample stream with a digital LO signal, and provide a downconverted sample stream for CDMA channel n. The digital LO signal for CDMA channel n has a frequency of $f_n$, which is determined by the carrier frequency $f_{chn}$ of CDMA channel n and the frequency $f_c$ of the analog LO signal used for downconversion from RF to baseband. Digital filter 244 may filter the downconverted sample stream to remove images caused by the digital downconversion and other undesired signal components. DVGA 246 may scale the filtered samples from filter 244 to obtain the desired amplitude and provide an output sample stream for CDMA channel n to a data processor 250. Although not shown in FIG.

2, the signals from mixer 216 to data processor 250 are typically complex signals and sample streams having inphase (I) and quadrature (Q) components.

RF receive chain 202, ADC 232 and pre-processor 234 may be wideband to support reception of N CDMA signals from N CDMA channels. Bandpass filter 214 may be wideband and may pass an entire frequency band, e.g., from 869 to 894 MHz for cellular band and from 1930 to 1990 MHz for Personal Communications Service (PCS) band. Analog lowpass filter 224 may have a fixed or variable bandwidth that may be sufficiently wide to pass all CDMA signals being received. The other analog circuit blocks within RF receive chain 202 may also be wideband to pass all of the CDMA signals. ADC 232 may be operated at a sufficiently high clock rate and may have sufficient resolution to digitize the analog baseband signal containing the N CDMA signals.

FIG. 2 shows a specific design of RF receive chain 202. In general, an RF receive chain may include one or more stages of amplifier, filter, mixer, etc. These circuit blocks may be arranged differently from the configuration shown in FIG. 2. An RF receive chain may also include different and/or additional circuit blocks not shown in FIG. 2. All or a portion of RF receive chain 202 may be implemented on one or more RF integrated circuits (RFICs), mixed-signal ICs, etc. For example, LNA 212, mixer 216, LO generator 218, VGA 220, summer 222, and analog lowpass filter 224 may be implemented on an RFIC, e.g., an RF receiver (RFR) or an RF transmitter/receiver (RTR) chip.

Data processor 250 may include various processing units for data reception and other functions. For example, data processor 250 may include a digital signal processor (DSP), a reduced instruction set computer (RISC) processor, a central processing unit (CPU), etc. A controller/processor 260 may control the operation of multi-carrier receiver 200. Memory 262 may store program codes and data for multi-carrier receiver 200. Digital section 204 may be implemented with one or more processors, which may be of different types. Digital section 204 may also be implemented with one or more application specific integrated circuits (ASICs) and/or other ICs.

Multi-carrier receiver 200 may be used in conjunction with a multi-carrier transmitter that can transmit on one or more CDMA channels simultaneously. The multi-carrier transmitter may process data and control information for one or more CDMA channels and generate an output RF signal. Duplexer 208 may route the output RF signal from the multi-carrier transmitter to antenna 206.

ADC 232 may be implemented with a delta-sigma ($\Delta\Sigma$) ADC that can spectrally shape quantization noise such that the noise is pushed from low frequencies toward higher frequencies. This noise shaping may allow the CDMA signals to observe less quantization noise inband and hence achieve higher signal-to-noise ratios (SNRs). The out-of-band quantization noise may be more easily filtered by subsequent digital filters. The noise spectrum of the $\Delta\Sigma$ ADC may be determined by an oversampling ratio (OSR), which is the ratio of the sampling rate of the $\Delta\Sigma$ ADC to the two-sided bandwidth of the CDMA signals being digitized. In general, a higher sampling rate may push the quantization noise higher in frequency, increase the bandwidth of the $\Delta\Sigma$ ADC, and improve SNR. However, the higher sampling rate may also result in higher power consumption. The sampling rate may be varied based on various factors such as the number of CDMA signals being received, the operating conditions (e.g., the desired CDMA signal level and undesired signal level), power consumption consideration, etc.

The $\Delta\Sigma$ ADC may use a reference voltage $V_{ref}$ for making approximations of changes in the analog baseband signal amplitude. This $V_{ref}$ voltage may determine the maximum signal level that can be captured by the $\Delta\Sigma$ ADC without clipping, which is often called the full-scale level. The $V_{ref}$ voltage may also determine the quantization noise, which is typically given relative to the $V_{ref}$ voltage. The $V_{ref}$ voltage may be varied based on various factors such as the number of CDMA signals being received, the CDMA signal level, the undesired signal level, etc. For example, the $V_{ref}$ voltage may be reduced when receiving multiple CDMA signals, when the CDMA signal level is low, etc. The lower $V_{ref}$ voltage may lower the quantization noise level and improve SNR for the scenarios described above. However, the noise floor of the $\Delta\Sigma$ ADC may come into play and become the limiting factor as the quantization noise level is dropped.

In general, wider bandwidth may be achieved for the $\Delta\Sigma$ ADC by increasing the sampling rate and/or lowering the $V_{ref}$ voltage. The wider bandwidth may accommodate reception of multiple CDMA signals simultaneously.

Figure 3:
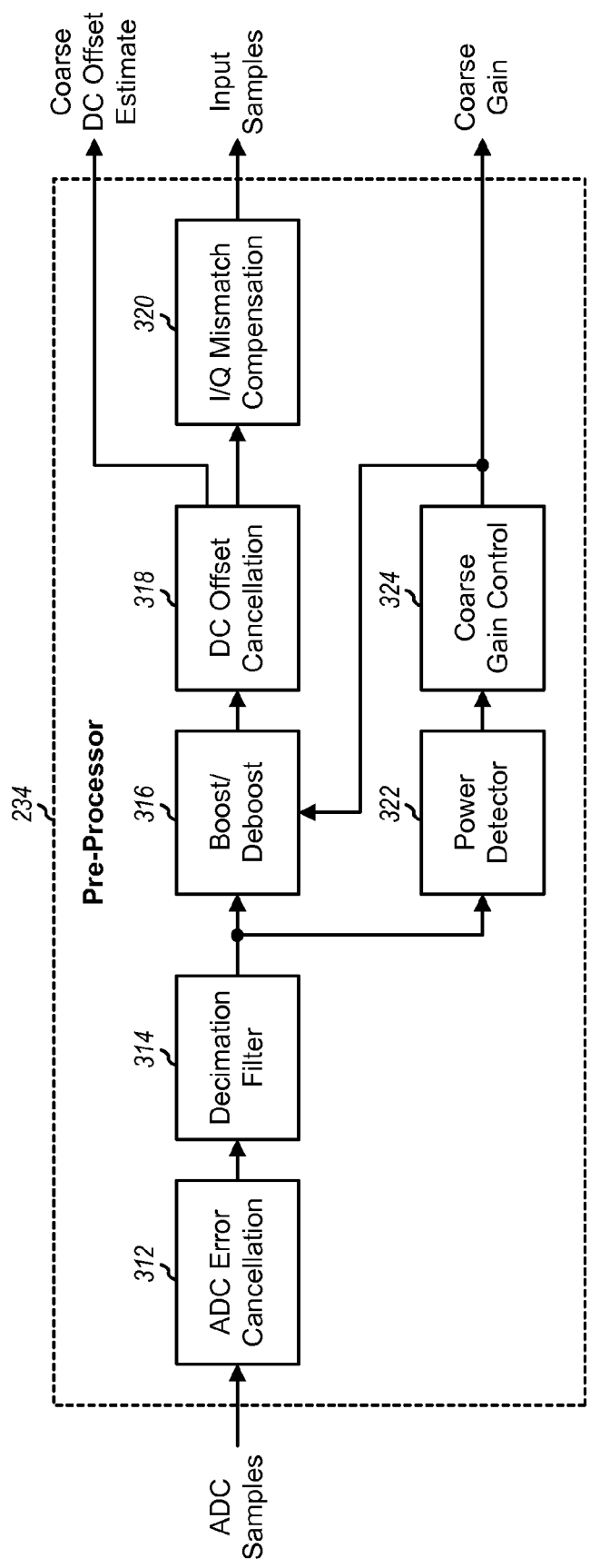
FIG. 3 shows a block diagram of a pre-processor within the multi-carrier receiver.

FIG. 3 shows a block diagram of a design of pre-processor 234 in FIG. 3. Within pre-processor 234, an ADC error cancellation unit 312 may receive one or more sample streams from ADC 232 and perform error cancellation. ADC 232 may be implemented with a $\Delta\Sigma$ ADC having multiple (e.g., two) $\Delta\Sigma$ modulator stages. A first $\Delta\Sigma$ modulator stage may convert the analog baseband signal to a first sample stream containing the CDMA signals and quantization noise of the first $\Delta\Sigma$ modulator. A second $\Delta\Sigma$ modulator stage may operate on the output of the first $\Delta\Sigma$ modulator and provide a second sample stream containing the CDMA signals and quantization noise of the two $\Delta\Sigma$ modulators. Unit 312 may combine the first and second sample streams to cancel the quantization noise of the first $\Delta\Sigma$ modulator and spectrally shape the quantization noise of the second $\Delta\Sigma$ modulator. The error cancellation by unit 312 may result in high dynamic range for ADC 232. The design of unit 312 may be dependent on the design of the $\Delta\Sigma$ modulators in ADC 232, as is known in the art.

A decimation filter 314 may include a pre-decimation filter followed by a downsampler. The pre-decimation filter may filter the samples from unit 312 to attenuate (i) spectral components or images that would fold inband after the subsequent decimation and (ii) spectrally shaped quantization noise from the $\Delta\Sigma$ ADC. The response of filter 314 may be selected to reduce passband droop while providing sufficient attenuation of the images that can fold inband by the decimation. The downsampler may downsample or decimate the samples from the pre-decimation filter by throwing out every m-th sample, e.g., every second sample for downsampling by a factor of two.

A boost/deboost unit 316 may be used for coarse gain adjustment. The received RF signal may include the desired CDMA signals as well as large undesired/interfering signals (or jammers) that may be located close in frequency to the CDMA signals. When jammers are detected, the gain (and hence amplitude) of the signals in RF receive chain 202 may be reduced (or deboost) to avoid saturation of the analog circuit blocks and ADC 232. The gain of unit 316 may be increased by a corresponding amount to maintain an approximately constant overall gain for the samples from unit 316. Conversely, when jammers are not detected, the gain of the signals in RF receive chain 202 may be increased (or boost) to more fully utilize the available dynamic range of ADC 232. The gain of unit 316 may be decreased by a corresponding amount.

A DC offset cancellation unit 318 may estimate the amount of DC offset in the samples from unit 316 and provide a coarse DC offset estimate to summer 222 within RF receive chain 202 for analog DC offset cancellation. Unit 318 may also estimate and remove residual/fine DC offset that is not removed by summer 222. Unit 318 may be implemented as described below.

An I/Q mismatch compensation unit 320 may perform I/Q compensation to correct for gain and phase mismatches between the I and Q paths in the analog quadrature downconversion from RF to baseband. Mixers 216 may comprise two mixers for the I and Q paths. The gain mismatch may be caused by different gains for these two mixers and/or amplitude imbalance of the analog I and Q LO signals from LO generator 218. The phase mismatch may result from the analog I and Q LO signals not being exactly 90° out of phase. The gain and/or phase mismatch may result in a residual sideband energy (RSB) image being generated in the downconverted signal from mixer 216. This RSB image may degrade performance, especially when the CDMA signals have a wide range of received powers, so that the RSB image may be relatively large in comparison to the weakest CDMA channel.

The RF signal at the input of mixer 216 may be expressed as:

$$R(t)=I(t)\cdot\cos(\omega_c t)-Q(t)\cdot\sin(\omega_c t), \quad \text{Eq (1)}$$

where I(t) and Q(t) are I and Q signal components,
R(t) is the RF signal at the input of mixer 216, and
$\omega_c=2\pi\cdot f_c$ is the analog LO frequency in radians/second.

The I and Q downconverted signals from mixer 216 may be expressed as:

$$I_{rx}(t)=R(t)\cdot\cos(\omega_c t)=I(t), \quad \text{Eq (2)}$$

$$Q_{rx}(t)=R(t)\cdot a\cdot\sin(\omega_c t+\phi)=a\cdot[I(t)\cdot\sin\phi+Q(t)\cdot\cos\phi], \quad \text{Eq (3)}$$

where $I_{rx}(t)$ and $Q_{rx}(t)$ are I and Q downconverted signals from mixer 216, and
a is the gain mismatch and $\phi$ is the phase mismatch.
Equations (2) and (3) lump both the gain and phase mismatches in the Q component.

The I/Q compensation to correct for the gain and phase mismatches may be expressed as:

$$I_{comp}(t)=I_{rx}(t), \text{ and} \quad \text{Eq (4)}$$

$$Q_{comp}(t)=A\cdot I_{rx}(t)+B\cdot Q_{rx}(t), \quad \text{Eq (5)}$$

where $I_{comp}(t)$ and $Q_{comp}(t)$ are I and Q compensated signals, and
$A=-\tan\phi$ and $B=1/(a\cdot\cos\phi)$.

Parameters a and $\phi$ may be obtained from calibration of RF receive chain 202. If the estimation of the gain and phase mismatches is accurate, then the I and Q compensated signals would include mostly the I and Q components, respectively.

I/Q mismatch compensation unit 320 may receive the I and Q samples from unit 318 and generate I and Q compensated samples, e.g., as shown in equations (4) and (5). The I and Q samples from unit 318 may correspond to $I_{rx}(t)$ and $Q_{rx}(t)$ in equations (4) and (5), and the I and Q samples from unit 320 may correspond to $I_{comp}(t)$ and $Q_{comp}(t)$. Unit 320 may also perform joint spectral inversion and I/Q mismatch compensation by setting $B=-1/(a\cdot\cos\phi)$.

A power detector 322 may estimate the power of the samples from filter 314. In one design, detector 322 may derive the power estimate as follows:

$$P_{est}=\Sigma\sqrt{I_{filtered}^2+Q_{filtered}^2}, \quad \text{Eq (6)}$$

where $I_{filtered}$ and $Q_{filtered}$ are I and Q samples from filter 314, and
$P_{est}$ is the power estimate from detector 322.

In another design, detector 322 may derive the power estimate as follows:

$$P_{est}=\sum \max(|I_{filtered}|,|Q_{filtered}|)+\frac{1}{2}\min(|I_{filtered}|,|Q_{filtered}|). \quad \text{Eq (7)}$$

The power estimate from equation (7) may be approximately equal to the power estimate from equation (6) but may be obtained with simpler computation. Detector 322 may also derive the power estimate in other manners. The power estimate from detector 322 may include all signal components passed by digital filter 314.

A coarse gain control unit 324 may receive the power estimate from detector 322 and select a coarse gain for RF receive chain 202 to avoid saturation of ADC 232. Unit 324 may select a larger gain for RF receive chain 202 when the power estimate $P_{est}$ is small to improve SNR. Unit 324 may select a smaller gain for RF receive chain 202 when the power estimate is large to avoid clipping of the signals. Unit 324 may compare the power estimate against one or more thresholds and, whenever the power estimate exceeds a threshold, select a lower coarse gain corresponding to the threshold.

A coarse automatic gain control (AGC) unit 252 within data processor 250 in FIG. 2 may receive the coarse gain from coarse gain control unit 324 in FIG. 3 and possibly other inputs. Unit 252 may select an appropriate gain $G_{LNA}$ for LNA 212 and an appropriate gain $G_{VGA}$ for VGA 220 in RF receive chain 202 based on the inputs. The gain of DVGA 246 may be varied by the inverse of the coarse gain for RF receive chain 202. Boost/deboost unit 316 may counteract the gain change implemented by coarse gain control unit 324, and the decisions by AGC unit 252 may be counteracted by DVGA 246.

FIG. 3 shows a specific design of pre-processor 234. In general, pre-processor 234 may process the samples from ADC 232 in various manners and may perform various functions such as digital filtering, decimation, resampling, DC offset cancellation, I/Q mismatch compensation, coarse scaling, etc. The digital processing blocks may also be arranged in different orders than the configuration shown in FIG. 3.

Figure 4:
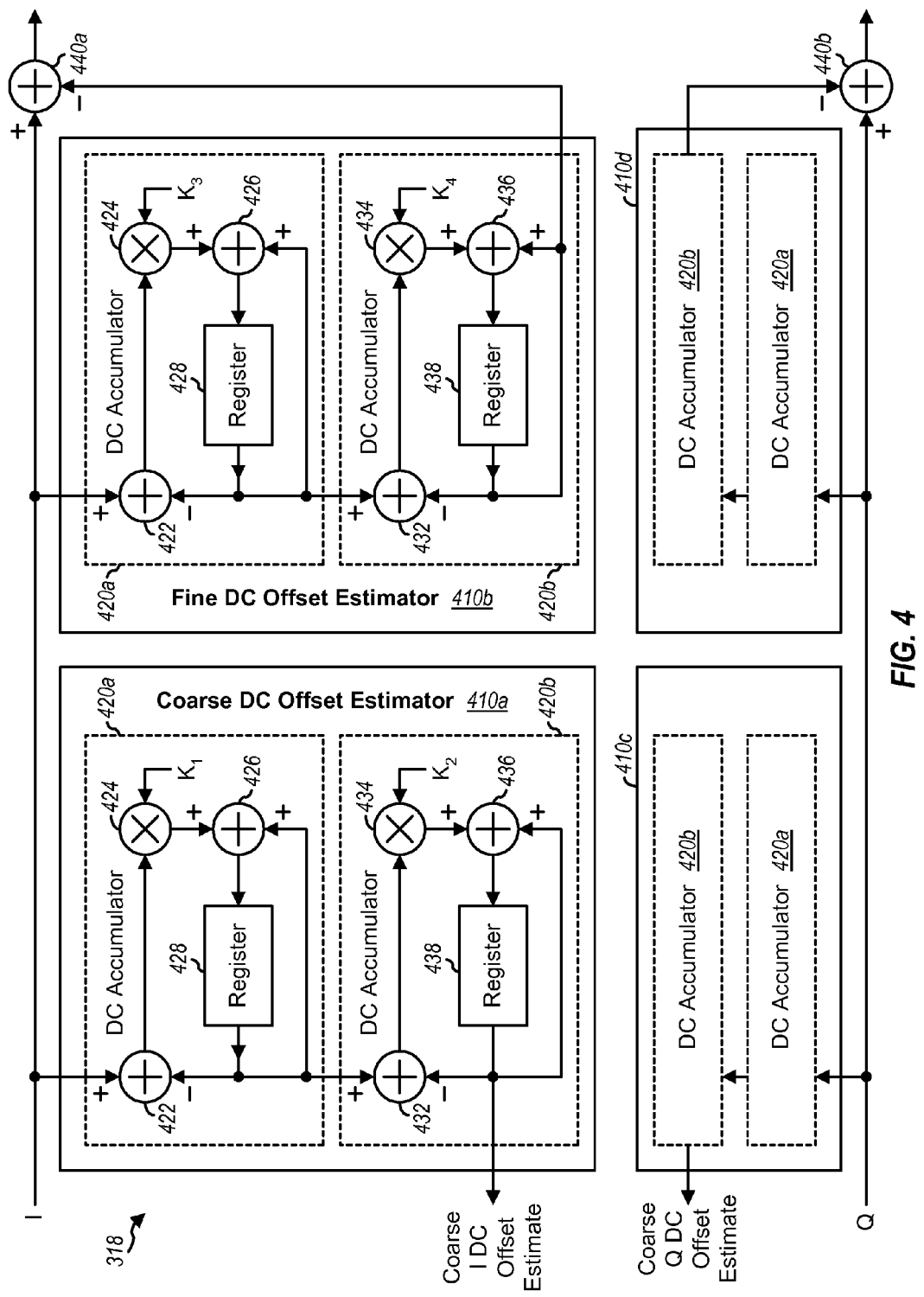
FIG. 4 shows a block diagram of a DC offset cancellation unit.

FIG. 4 shows a block diagram of a design of DC offset cancellation unit 318 within pre-processor 234 in FIG. 3. In this design, unit 318 includes a coarse DC offset estimator 410a and a fine DC offset estimator 410b for the I sample stream and a coarse DC offset estimator 410c and a fine DC offset estimator 410d for the Q sample stream. In the design shown in FIG. 4, each DC offset estimator 410 includes two DC accumulators 420a and 420b, which are coupled in cascade.

Within coarse DC offset estimator 410a for the I sample stream, a summer 422 within DC accumulator 420a subtracts the output of a register 428 from an I sample. A multiplier 424 multiplies the output of summer 422 with a gain $K_1$. A summer 426 sums the output of multiplier 424 with the output of register 428 and provides its output to register 428. Register 428 and summer 426 form an accumulator that accumulates the output of multiplier 424. Within DC accumulator 420b, a summer 432 subtracts the output of a register 438 from the output of register 428. A multiplier 434 multiplies the output of summer 432 with a gain $K_2$. A summer 436 sums the output of multiplier 434 with the output of register 438 and provides its output to register 438. Register 438 and summer 436 form an accumulator that accumulates the output of multiplier 434. Register 438 provides a coarse DC offset estimate for the I path.

Fine DC offset estimator 410b for the I sample stream includes DC accumulators 420a and 420b that are coupled and operated in similar manner as the DC accumulators in coarse DC offset estimator 410a. However, gain $K_3$ is applied to multiplier 424 and gain $K_4$ is applied to multiplier 434 within fine DC offset estimator 410b. Register 438 in fine DC offset estimator 410b provides a fine DC offset estimate for the I path.

Coarse DC offset estimator 410c for the Q sample stream may be the same as coarse DC offset estimator 410a for the I sample stream and may use gain $K_1$ for multiplier 424 and gain $K_2$ for multiplier 434. Fine DC offset estimator 410d for the Q sample stream may be the same as fine DC offset estimator 410b for the I sample stream and may use gain $K_3$ for multiplier 424 and gain $K_4$ for multiplier 434.

Coarse DC offset estimators 410a and 410c may estimate coarse DC offset in the I and Q sample streams, respectively. The coarse I and Q DC offset estimates may be provided to summer 222 within RF receive chain 202 and used to remove DC offset in the analog I and Q baseband signals. Fine DC offset estimators 410c and 410d may estimate fine DC offset in the I and Q sample streams, respectively. A summer 440a may subtract the fine I DC offset estimate from the I samples and provide I DC corrected samples. Similarly, a summer 440b may subtract the fine Q DC offset estimate from the Q samples and provide Q DC corrected samples.

Gains $K_1$, $K_2$, $K_3$ and $K_4$ may be selected to obtain the desired performance for DC offset cancellation. Each gain may determine the time constant of the associated DC accumulator. Fine DC offset estimators 410b and 410d may have larger time constants (and hence smaller gains) than those of coarse DC offset estimators 410a and 410c. Each DC offset estimator 410 may also support multiple operating modes, e.g., an acquisition mode and a tracking mode. The acquisition mode may have a shorter time constant and may be used to quickly estimate and correct DC offset. The tracking mode may have a longer time constant and may be used to more accurately estimate and correct DC offset.

DC offset cancellation unit 318 may support the update modes shown in Table 1.

TABLE 1

| Mode | Description |
| --- | --- |
| Coarse DC offset only | Coarse DC offset is estimated and periodically provided to RF receive chain 202. Gains $K_3$ and $K_4$ are set to zero to disable fine DC offset estimators 410b and 410d. |
| Fine DC offset only | Fine DC offset is estimated and removed from the I and Q samples. Gains $K_1$ and $K_2$ are set to zero to disable coarse DC offset estimators 410a and 410c. |
| Coarse and fine DC offset | Coarse DC offset is estimated and provided once or periodically to RF receive chain 202. Fine DC offset is estimated and removed from the I and Q samples. |

The design in FIG. 4 uses two DC accumulators 420a and 420b for each DC offset estimator 410. The additional DC accumulator 420b may provide better attenuation of out-of-band spectral components such as jammers. This may result in more accurate DC offset estimates. In general, each DC offset estimator may include any number of sections, and each section may have any transfer function. For example, each section may correspond to a first order DC accumulator shown in FIG. 4.

Referring back to FIG. 2, pre-processor 234 may provide the input sample stream to each of rotators 242a through 242n for the N CDMA channels. Each rotator 242 may digitally downconvert the input sample stream from frequency $f_n$ for its CDMA channel n to DC. In one design, each rotator 242 may be implemented with a complex multiplier that may multiply the input sample stream with a digital LO signal at frequency $f_n$ to obtain a downconverted sample stream. In another design, each rotator 242 may perform Coordinate Rotational Digital Computer (CORDIC) computation. A CORDIC algorithm is an iterative algorithm that allows for fast hardware calculation of trigonometric functions using simple shift and add/subtract hardware.

A complex input sample, $I_{in}+jQ_{in}$, may be rotated by an angle θ, as follows:

$$I_{rot}+jQ_{rot}=(I_{in}+jQ_{in}) \cdot e^{j\theta}, \quad \text{Eq (8)}$$

$$I_{rot}=I_{in}\cdot\cos\theta-Q_{in}\cdot\sin\theta=\cos\theta\cdot(I_{in}-Q_{in}\cdot\tan\theta), \text{ and} \quad \text{Eq (9)}$$

$$Q_{rot}=Q_{in}\cdot\cos\theta+I_{in}\cdot\sin\theta=\cos\theta\cdot(Q_{in}+I_{in}\cdot\tan\theta), \quad \text{Eq (10)}$$

where $I_{rot}+jQ_{rot}$ is a complex rotated sample.

Angle θ may be constrained to be within a range from 0 to 90°. Angle θ may then be represented with a sum of smaller angles, as follows:

$$\theta = \sum_{i=0}^{L-1} d_i \cdot \theta_i \quad \text{Eq (11)}$$

where $\theta_i = \arctan(½^i)$ is the i-th smaller angle,
$d_i \in \{-1, +1\}$ is a sign bit for the i-th smaller angle, and
L is the number of smaller angles used to approximate angle θ.

Angle $\theta_i$ is equal to 45° for i=0, is progressively smaller for larger values of i, and is fixed and known for each value of i. Angle θ may be approximated by either adding or subtracting each successively smaller angle $\theta_i$. Angle $\theta_i$ is added if $d_i=+1$ and is subtracted if $d_i=+1$. Hence, angle θ may be defined by a sequence of values for sign bit $d_i$, which may defined as:

$$\varphi_0 = \theta, \quad \text{Eq (12)}$$

$$d_i = \begin{cases} -1 & \text{if } \varphi_i < 0 \\ +1 & \text{otherwise} \end{cases} \text{ for } i = 0, 1, \ldots, L-1, \quad \text{Eq (13)}$$

$$\varphi_{i+1} = \varphi_i - d_i \cdot \arctan(2^{-i}). \quad \text{Eq (14)}$$

The number of smaller angles or iterations (L) determines the accuracy of the approximation of angle θ with a sum of smaller angles. For example, angle θ may be approximated with an accuracy of ±0.112° for L=10 iterations, ±0.028° for L=12 iterations, etc. L may be any suitable value.

The complex input sample, $I_{in}+jQ_{in}$, may be rotated by successively smaller angle $\theta_i$, as follows:

$$I_{i+1}=K_i\cdot(I_i-d_i\cdot Q_i/2^i), \text{ and} \quad \text{Eq (15)}$$

$$Q_{i+1}=K_i\cdot(Q_i+d_i\cdot I_i/2^i) \quad \text{Eq (16)}$$

where $I_i+jQ_i$ is a complex rotated sample for the i-th iteration, and
$K_i$ is a CORDIC gain for the i-th iteration.

The division by $2^i$ in equations (15) and (16) corresponds to right shift by i bits. The calculation for equations (15) and (16) may thus be performed with shift, add and subtract operations. The CORDIC gain $K_i$ is dependent on the number of iterations completed and may be accounted for by other circuit blocks (e.g., pre-processor 234 or DVGA 246) within digital section 204.

Figure 5:
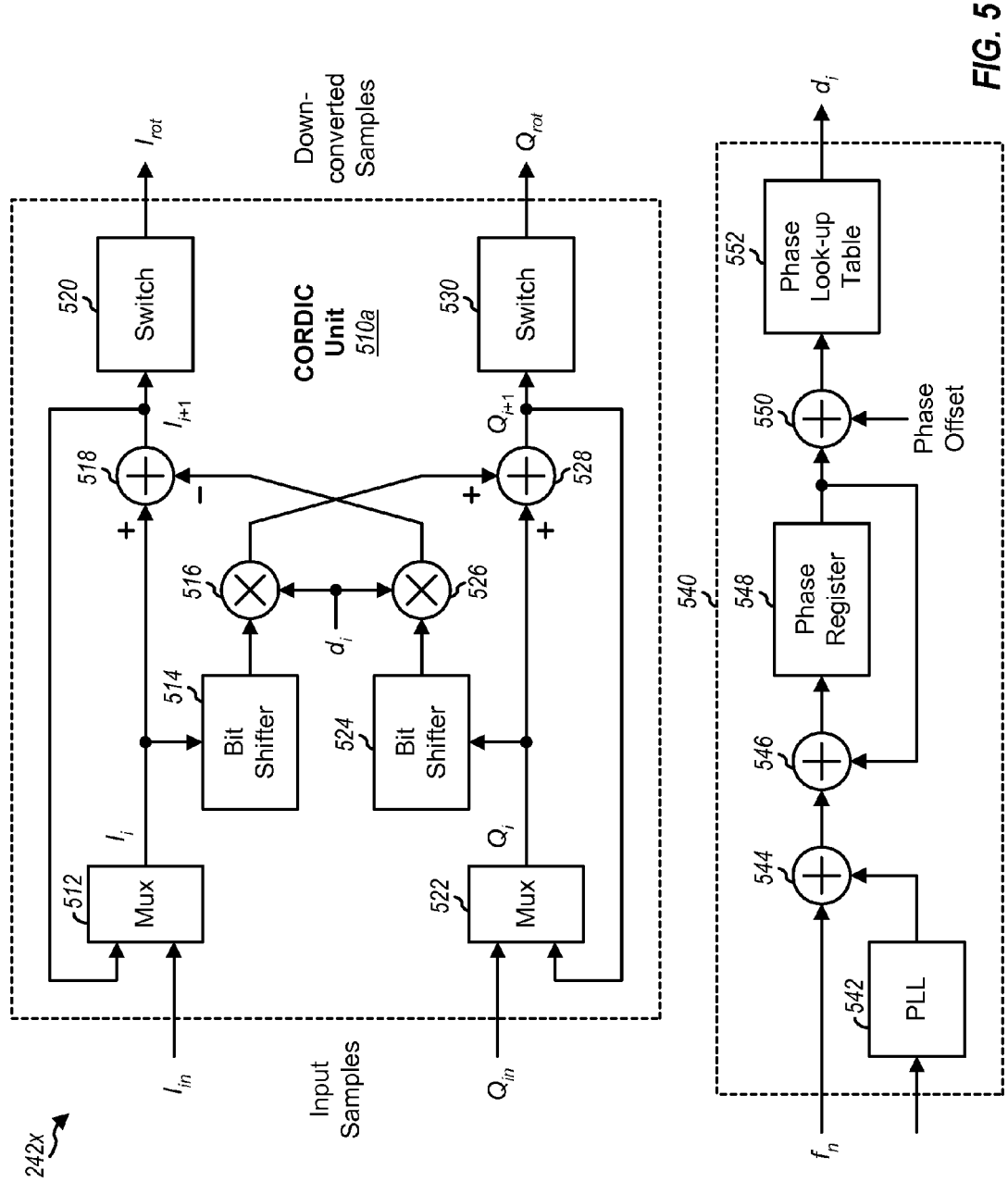
FIG. 5 shows a block diagram of a rotator for digital downconversion.

FIG. 5 shows a block diagram of a design of a rotator 242x, which may be used for each of rotators 242a through 242n in FIG. 2. Rotator 242x includes a CORDIC unit 510a and a phase computation unit 540. CORDIC unit 510a performs CORDIC computation for digital downconversion of the input sample stream for one CDMA channel n. Phase computation unit 540 determines the phase for each input sample for CDMA channel n.

Within CORDIC unit 510a, multiplexers (Mux) 512 and 522 receive $I_{in}$ and $Q_{in}$ input samples, respectively, from pre-processor 234 and provide these samples for the first iteration, or i=0. Shifters 514 and 524 shift the samples from multiplexers 512 and 522, respectively, to the right by i bits for the i-th iteration. Multipliers 516 and 526 multiply the samples from shifters 514 and 524, respectively, with sign bit $d_i$. A summer 518 subtracts the output of multiplier 526 from the output of multiplexer 512 and provides sample $I_{i+1}$, as shown in equation (15). A summer 528 sums the output of multiplier 516 with the output of multiplexer 522 and provides sample $Q_{i+1}$, as shown in equation (16). Multiplexers 512 and 522 receive samples $I_{i+1}$ and $Q_{i+1}$ from summers 518 and 528, respectively, and provide these samples for each subsequent iteration, or i>0. After all L iterations are completed, switches 520 and 530 provide samples $I_{i+1}$ and $Q_{i+1}$ from summers 518 and 528 as the $I_{rot}$ and $Q_{rot}$ rotated samples, respectively.

Within phase computation unit 540, a PLL 542 determines frequency error of CDMA channel n, e.g., based on pilot estimates for this CDMA channel. A summer 544 sums frequency $f_n$ for CDMA channel n (which may be a fixed computed value) and the frequency error of CDMA channel n (which may be tracked based on the CDMA signal received from CDMA channel n). A summer 546 and a register 548 form a phase accumulator that accumulates the output of summer 544 in each sample period. The bit-width of the phase accumulator may be selected based on the highest downconversion frequency and the desired frequency resolution. For example, a 23-bit phase accumulator supports a frequency range of ±9.83 MHz with a frequency resolution of 2.34 Hz. In each sample period, a summer 550 sums the current phase value from register 548 with a phase offset, which may be used to account for different phases associated with different states of LNA 212 or VGA 220 in RF receive chain 202. In each sample period, a phase look-up table 552 receives the phase value from summer 550 and provides a corresponding L-bit sequence for the sign bit $d_i$.

Pre-processor 234 may provide input samples at a sample rate of $f_{sample}$. Rotator 242x may be operated at a clock speed of $L \cdot f_{sample}$ to provide a downconverted sample in each sample period with a delay of one sample period, where L is the number of iterations. If this clock speed is too high, then the CORDIC unit may be implemented with multiple pipeline stages and operated at a lower clock speed.

Figure 6:
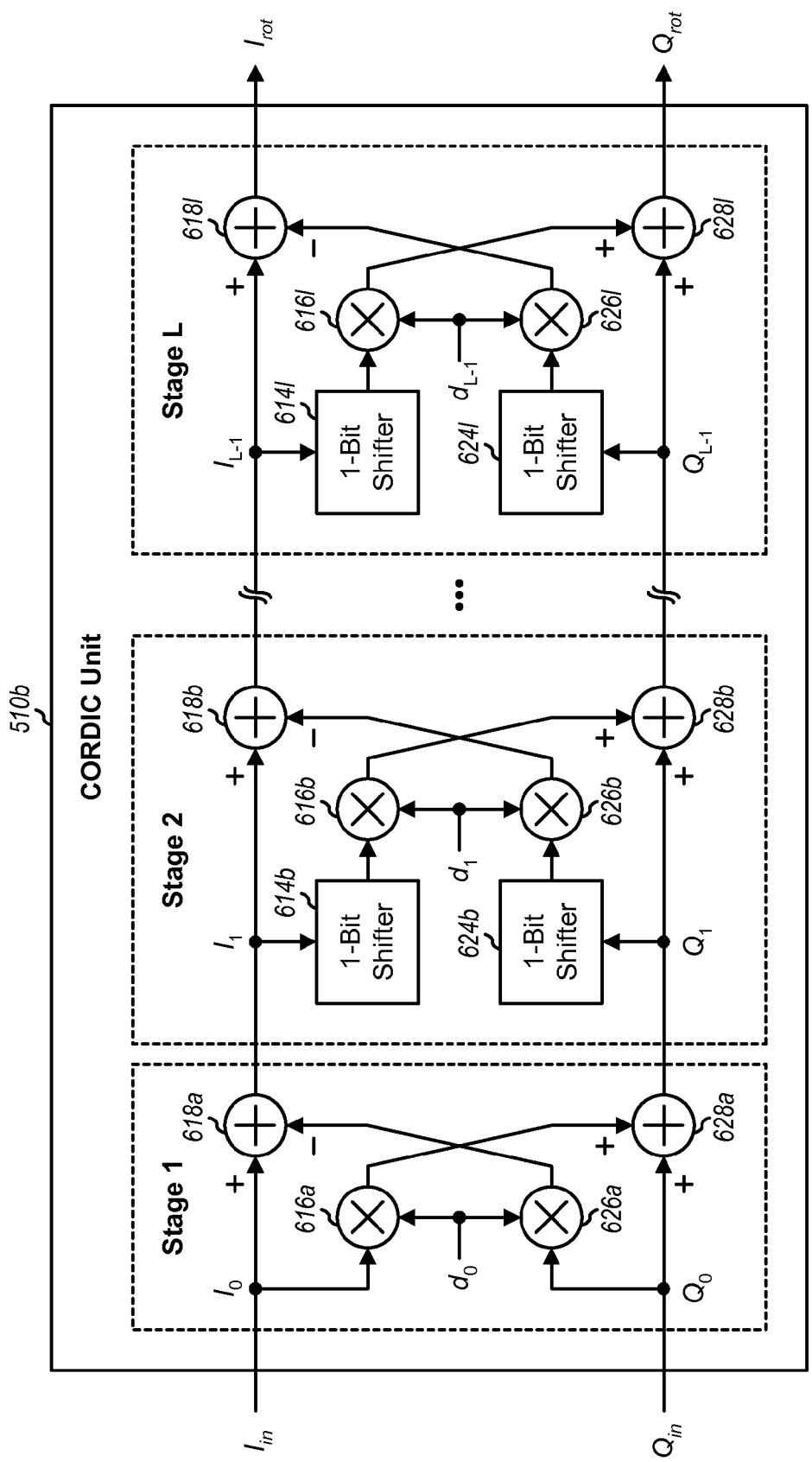
FIG. 6 shows a block diagram of a CORDIC unit within the rotator.

FIG. 6 shows a block diagram of a design of a CORDIC unit 510b, which performs CORDIC computation in multiple (L) pipeline stages. CORDIC unit 510b may be used in place of CORDIC unit 510a in FIG. 5.

Within the first stage of CORDIC unit 510b, multipliers 616a and 626a multiply the $I_{in}$ and $Q_{in}$ input samples, respectively, from pre-processor 234 with sign bit $d_0$. A summer 618a subtracts the output of multiplier 626a from the $I_{in}$ sample and provides an $I_1$ sample. A summer 628a sums the output of multiplier 616a with the $Q_{in}$ sample and provides a $Q_1$ sample. Within the second stage, shifters 614b and 624b shift the $I_1$ and $Q_1$ samples from the first stage to the right by one bit. Multipliers 616b and 626b multiply the outputs of shifters 614b and 624b, respectively, with sign bit $d_1$. A summer 618b subtracts the output of multiplier 626b from the $I_1$ sample and provides an $I_2$ sample. A summer 628a sums the output of multiplier 616b with the $Q_1$ sample and provides a $Q_2$ sample. Each subsequent stage operates in similar manner as the second stage. Summers 618l and 628l from the last stage provide the $I_{rot}$ and $Q_{rot}$ rotated samples, respectively.

CORDIC unit 510b may be operated at a clock speed equal to the input sample rate of $f_{sample}$. CORDIC unit 510b may provide a downconverted sample in each sample period with a pipeline delay of L sample periods.

Figure 7:
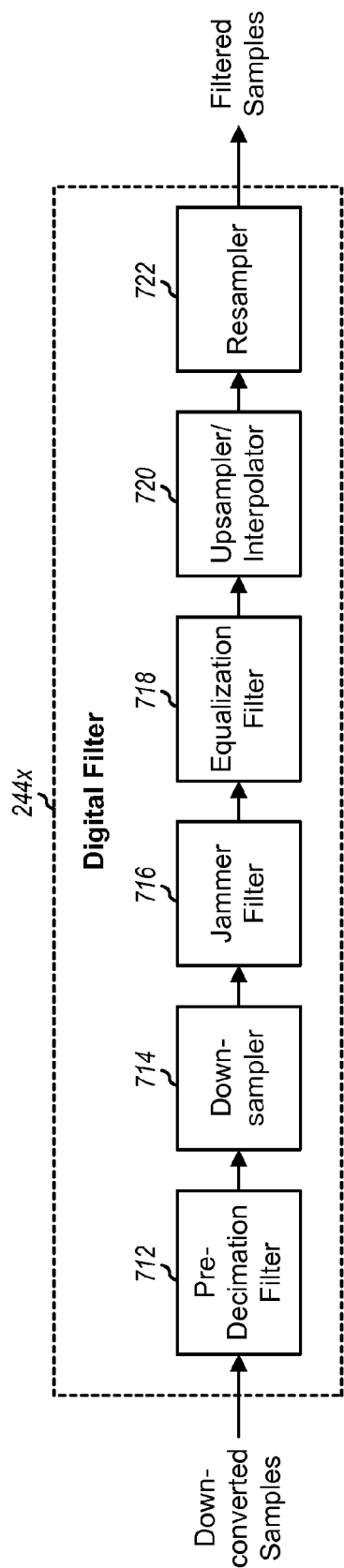
FIG. 7 shows a block diagram of a digital filter.

FIG. 7 shows a block diagram of a design of a digital filter 244x, which may be used for each of digital filters 244a through 244n in FIG. 2. Within digital filter 244x, a pre-decimation filter 712 may filter the downconverted samples from an associated rotator 242 to attenuate spectral components that would fold inband after the subsequent decimation. Filter 712 may be implemented with one or more filter stages and may provide sufficient attenuation of the undesired spectral components while reducing the amount of passband droop. A downsampler 714 may decimate or downsample the samples from filter 712 by throwing out every m-th sample. Multiple stages of pre-decimation filter 712 and downsampler 714 may be coupled in cascade.

A jammer filter 716 may filter the samples from downsampler 714 to attenuate out-of-band components, including jammers, which may be present in the samples from downsampler 714. Jammer filter 716 may have a bandwidth approximately equal to the bandwidth of one CDMA signal. An equalization filter 718 may compensate for (i) amplitude and/or phase distortion in the passband due to digital filters 712, 714 and 716 and/or analog lowpass filter 224 and (ii) any known distortion caused by the transmitter at the access point. An upsampling/interpolation filter 720 may perform interpolation on the samples from equalization filter 718. Interpolation filter 720 may be implemented with one or more stages, with each stage performing upsampling to a higher rate and filtering to remove images resulting from the upsampling.

A resampler 722 may perform sample rate conversion on the samples from interpolation filter 720. In one design, a divider may divide the analog LO signal from LO generator 218 by an integer factor to obtain the sampling clock for ADC 232. The ADC sampling clock frequency may not be an integer multiple of the chip rate, which is 1.2288 megachips/second (Mcps) for HRPD. Resampler 722 may resample the samples from filter 720 to obtain samples at an integer multiple of the chip rate.

Filters 712, 716, 718 and 720 may each be implemented with any number of stages. Each stage may be implemented with a finite impulse response (FIR) filter, an infinite impulse response (IIR) filter, or some other filter structure. Each stage may have any suitable response, which may be fixed or programmable. The response of a given stage may be programmable based on various factors such as the number of CDMA signals being received, the bandwidth of analog lowpass filter 224, whether or not jammers are detected, etc. Each stage may also be enabled or bypassed.

FIG. 7 shows a specific design of digital filter 244x for one CDMA channel. In general, digital filter 244x may process the downconverted samples from an associated rotator 242 in various manners and may perform various functions such as digital filtering, decimation, downsampling, upsampling, resampling, DC offset cancellation, I/Q mismatch compensation, scaling, etc. The digital processing blocks may also be arranged in different orders than the configuration shown in FIG. 7.

Figure 8:
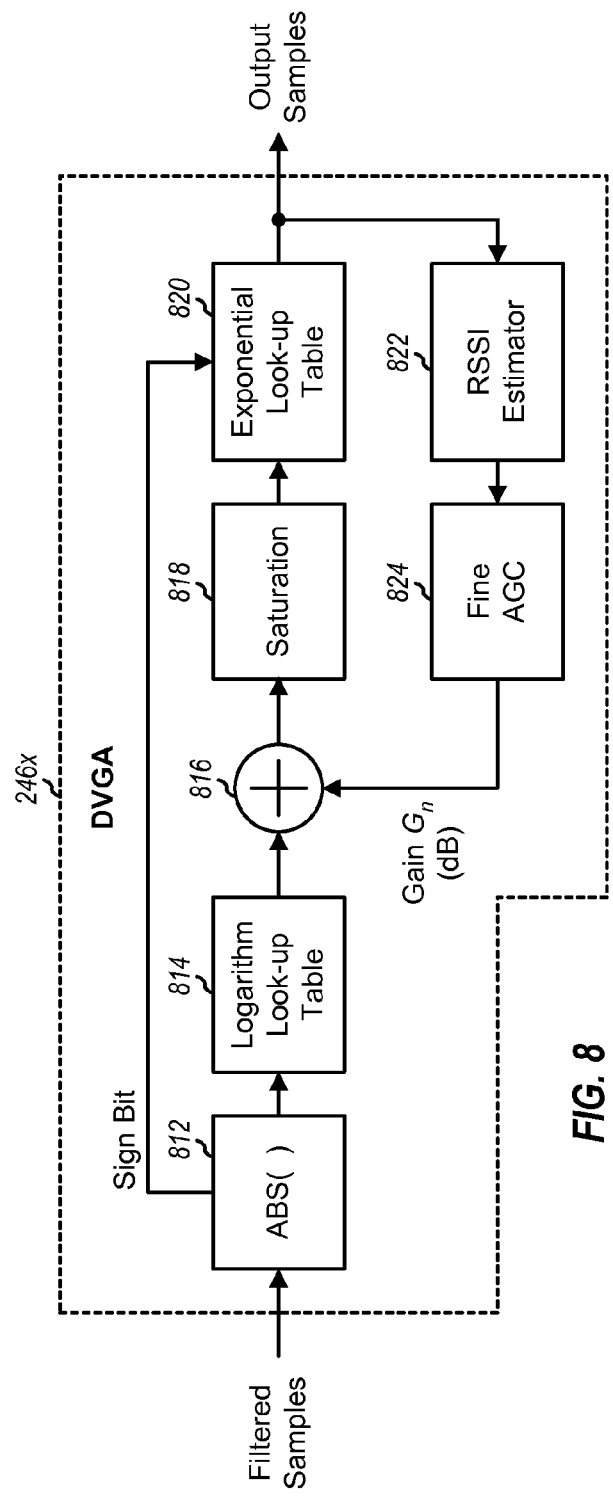
FIG. 8 shows a block diagram of a digital variable gain amplifier (DVGA).

FIG. 8 shows a block diagram of a design of DVGA 246x, which may be used for each of DVGA 246a through 246n in FIG. 2. DVGA 246x may multiply each filtered sample from an associated digital filter 244 with a digital gain and provide a corresponding output sample. The multiplication may be performed in the logarithmic (log) domain as shown in FIG. 8. This log implementation may provide better performance, especially if the filtered samples have many bits of resolution due to the digital processing and the output samples have much fewer bits of resolution.

Within DVGA 246x, a unit 812 may receive a filtered sample in linear domain, provide the magnitude of the filtered sample to a log look-up table 814, and provide the sign of the filtered sample to an exponential look-up table 820. Look-up table 814 may provide the log of the sample magnitude. A summer 816 may sum the log sample magnitude from table 814 with a log gain $G_n$ to perform multiplication in the log domain. A saturation unit 818 may constrain the output of summer 816 to be within a predetermined range of values. Exponential look-up table 820 may provide the exponential of the output of unit 818, append the sign from unit 812, and provide the output sample in linear domain.

A received signal strength indicator (RSSI) estimator 822 may estimate the received signal strength $P_{ch}$ of the output samples from look-up table 820, e.g., as shown in equation (6) or (7) or based on some other equation such as $P_{ch} = \Sigma |I_{out}| + |Q_{out}|$. A fine AGC unit 824 may receive the RSSI measurements from estimator 822 and determine the digital gain $G_n$ for CDMA channel n. Coarse AGC unit 252 within data processor 250 may use the digital gains $G_1$ through $G_N$ for all N CDMA channels and the coarse gain from unit 324 in FIG. 3 to determine the gain $G_{LNA}$ for LNA 212 and/or the gain $G_{VGA}$ for VGA 220 in RF receive chain 202.

Figure 9:
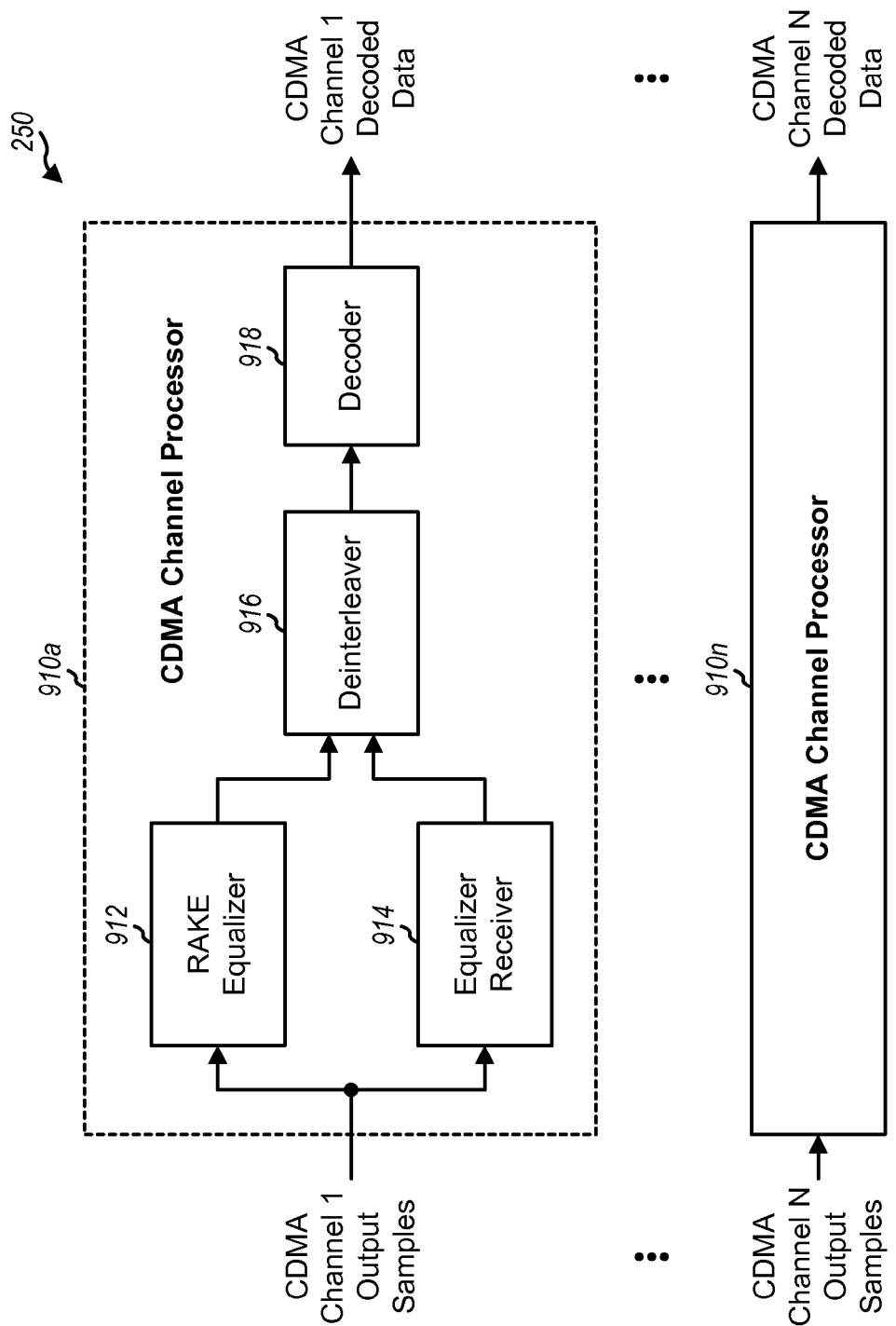
FIG. 9 shows a block diagram of a CDMA channel processor.

FIG. 9 shows a block diagram of a design of CDMA channel processors 910a through 910n, which may be implemented by data processor 250 in FIG. 2 and used for N CDMA channels. In the design shown in FIG. 9, CDMA channel processor 910a includes a RAKE receiver 912 and an equalizer receiver 914, one of which may be selected to process the CDMA signal for CDMA channel 1. RAKE receiver 912 may be selected for some operating scenarios (e.g., low SNR) and equalizer receiver 914 may be selected for other operating scenarios (e.g., high SNR and/or high data rate). In general, either RAKE receiver 912 or equalizer receiver 914 may be selected depending on which receiver can provide better performance.

RAKE receiver 912 may process the output sample stream for CDMA channel 1 for one or more signal paths (or multipaths) detected for CDMA channel 1. RAKE receiver 912 may perform various functions such as despreading with a complex pseudo-random number (PN) sequence used by an access point, decovering with Walsh codes used for data, pilot and overhead channels, pilot estimation, coherent demodulation of the decovered symbols with pilot estimates, symbol combining across the multipaths, etc. Equalizer receiver 914 may process the output sample stream for CDMA channel 1. Equalizer receiver 914 may perform various functions such as pilot estimation, derivation/adaptation of filter coefficients, filtering of the output samples with the filter coefficients, despreading with the complex PN sequence, decovering with the Walsh codes, symbol scaling, etc.

A deinterleaver 916 may receive symbol estimates from RAKE receiver 912 or equalizer receiver 914 and may deinterleave (or reorder) the symbol estimates in a manner complementary to the interleaving performed by the access point. A decoder 918 may decode the deinterleaved symbol estimates and provide decoded data for CDMA channel 1. In general, the processing by multi-carrier receiver 200 for each frequency channel is dependent on the processing performed for the frequency channel by the transmitter or access point.

FIG. 10 shows a design of a process 1000 for receiving signals from multiple frequency channels. A frequency channel may be a CDMA channel, a GSM channel, an RF channel, a carrier, etc. An analog baseband signal comprising multiple signals on multiple frequency channels may be digitized with an ADC, e.g., a $\Delta\Sigma$ ADC (block 1012). The multiple signals on the multiple frequency channels may correspond to multiple CDMA signals on multiple CDMA channels in an HRPD system. The $\Delta\Sigma$ ADC may be operated with a variable sampling clock and/or a variable reference voltage, which may be determined based on the bandwidth of the multiple frequency channels being received, the characteristics of the signals being received (e.g., presence or absence of jammers, strong or weak desired signals, etc.) and/or other factors.

An input sample stream comprising the multiple signals on the multiple frequency channels may be obtained by processing one or more sample streams from the ADC (block 1014). The processing in block 1014 may include error cancellation, digital filtering, DC offset cancellation, I/Q mismatch compensation, coarse scaling, etc. The different types of processing may be performed in various orders, one example of which is shown in FIG. 3. If the $\Delta\Sigma$ ADC provides multiple sample streams, then error cancellation may be performed to combine these multiple sample streams. For DC offset cancellation, a coarse DC offset may be estimated with a first set of at least one DC accumulator, and a fine DC offset may be estimated with a second set of at least one DC accumulator, e.g., as shown in FIG. 4. Each set may include multiple DC accumulators coupled in cascade. The estimated fine DC offset may be canceled from the input sample stream. The estimated coarse DC offset may be provided and used for analog DC offset cancellation. For I/Q mismatch compensation, gain and/or phase mismatch of the analog quadrature downconversion from RF to baseband may be estimated and used to derive correction factors A and B. I/Q mismatch compensation may then be performed for the input sample stream based on the correction factors A and B to compensate for the gain and/or phase mismatches, e.g., as shown in equations (4) and (5). For coarse scaling or boost/deboost, saturation of the ADC may be detected, e.g., based on the power of the samples prior to the coarse scaling. A first gain may be applied for the input sample stream if saturation of the ADC is detected. A second gain that is smaller than the first gain may be applied for the input sample stream if saturation of the ADC is not detected.

The input sample stream may be digitally downconverted from a different frequency for each of the multiple frequency channels to obtain a downconverted sample stream for the frequency channel (block 1016). The digital downconversion may be based on CORDIC computation, e.g., using an iterative CORDIC unit shown in FIG. 5 or a pipeline CORDIC unit shown in FIG. 6. For each frequency channel, a center frequency $f_n$ may be determined based on a carrier frequency $f_{chn}$ of that frequency channel and an analog LO signal frequency $f_c$. A frequency error may also be estimated, e.g., with a PLL. An instantaneous frequency may be determined based on the computed center frequency and the estimated frequency error. The input sample stream may be digitally downconverted based on the instantaneous frequency.

The downconverted sample stream for each frequency channel may be digitally processed to obtain an output sample stream for that frequency channel (block 1018). The digital processing may include digital filtering, downsampling, equalization filtering, upsampling, sample rate conversion, fine scaling, DC offset cancellation, etc. The different types of digital processing may be performed in various orders, one example of which is shown in FIGS. 2 and 7. For each frequency channel, the downconverted sample stream may be digitally filtered to pass a desired signal and to attenuate undesired signals, e.g., jammers and unwanted images. Equalization filtering may be performed to compensate for amplitude and phase distortion due to all of the filtering performed for the frequency channel. Sample rate conversion may be performed to obtain the output sample stream at a desired sample rate, which may be related to the chip rate by an integer factor. For fine scaling, a digital gain may be determined for the frequency channel based on the received signal strength of the output sample stream. Digital scaling may be performed (e.g., in the log domain as shown in FIG. 8) for the output sample stream based on the gain. The output sample stream for each frequency channel may be processed, e.g., with a RAKE receiver or an equalizer receiver as shown in FIG. 9, to obtain symbol estimates for the frequency channel (block 1020). The symbol estimates for each frequency channel may be deinterleaved and decoded to obtain data and/or signaling sent on the frequency channel (block 1022).

Coarse AGC may be performed for the input sample stream for all frequency channels, e.g., by adjusting the gains of analog circuit blocks such as LNA 212, VGA 220, etc. Fine AGC may be performed independently for the output sample stream for each frequency channel, e.g., by adjusting the gain of DVGA 246. This may allow for reception of multiple signals with different received power levels.

FIG. 11 shows a design of a process 1100 for receiving multiple frequency channels with a single RF receive chain. A received RF signal comprising multiple signals on multiple frequency channels may be amplified with an LNA (block 1112). Filtering may or may not be performed after amplification with the LNA. An input RF signal comprising the multiple signals on the multiple frequency channels may be downconverted from RF to baseband to obtain a downconverted signal (block 1114). The input RF signal may be from the LNA or a filter after the LNA.

The downconverted signal may be amplified (e.g., with a VGA) to obtain an amplified signal (block 1116). The amplified signal may be filtered with an analog filter to obtain an analog baseband signal comprising the multiple signals on the multiple frequency channels (block 1118). The analog filter may have a fixed bandwidth determined based on the largest possible bandwidth of the multiple frequency channels. The analog filter may also have a variable bandwidth determined based on the bandwidth of the multiple frequency channels being received. A first gain may be used (e.g., for the LNA and/or VGA) if saturation of an ADC is detected. A second gain that is higher than the first gain may be used if saturation of the ADC is not detected.

The multiple signals on the multiple frequency channels may differ from multiple subcarriers in an OFDM signal in the following manners. First, the frequencies of the multiple frequency channels may be selected independently by the transmitter (subject to a minimum spacing criterion) whereas the subcarriers in OFDM are constrained to specific frequencies/locations in order to maintain orthogonality. Second, the frequency channels are individually filtered at the receiver whereas the subcarriers in OFDM are not filtered. Third, a cyclic prefix is appended to each OFDM symbol by the transmitter and removed by the receiver. A cyclic prefix is not used for the multiple signals on the multiple frequency channels. Fourth, each frequency channel may carry data and control channels whereas data is typically sent across many subcarriers in OFDM. Fifth, each frequency channel may be transmitted and received independently of the other frequency channels whereas all subcarriers are typically sent and received for OFDM.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
  a delta-sigma analog-to-digital converter ($\Delta\Sigma$ ADC) to digitize an analog baseband signal comprising multiple signals on multiple frequency channels, and to generate an input sample stream for the multiple frequency channels, wherein the ΔΣ ADC has a variable reference voltage based on at least one of a bandwidth of the multiple frequency channels being received or a total number of the multiple signals being received; and at least one processor to digitally down convert the input sample stream for the multiple frequency channels to generate multiple down converted sample streams, one down converted sample stream for each frequency channel, and to digitally process the down converted sample stream for each frequency channel to generate an output sample stream for the frequency channel, wherein the at least one processor detects for saturation of the ΔΣ ADC, applies a first gain for the input sample stream if saturation of the ΔΣ ADC is detected, and applies a second gain smaller than the first gain for the input sample stream if saturation of the ΔΣ ADC is not detected.

2. The apparatus of claim 1, wherein the ΔΣ ADC provides multiple sample streams, and wherein the at least one processor performs error cancellation to combine the multiple sample streams from the ΔΣ ADC.

3. The apparatus of claim 1, wherein the ΔΣ ADC is operated with a variable sampling clock determined based on the bandwidth of the multiple frequency channels being received.

4. The apparatus of claim 1, wherein the at least one processor performs direct current (DC) offset cancellation for the input sample stream.

5. The apparatus of claim 1, wherein the at least one processor estimates coarse direct current (DC) offset with a first set of at least one DC accumulator, estimates fine DC offset with a second set of at least one DC accumulator, cancels the estimated fine DC offset from the input sample stream, and provides the estimated coarse DC offset for analog DC offset cancellation.

6. The apparatus of claim 5, wherein each of the first and second sets includes multiple DC accumulators coupled in cascade.

7. The apparatus of claim 1, wherein the at least one processor performs I/Q mismatch compensation for the input sample stream to compensate for gain and phase mismatches of analog quadrature down conversion from radio frequency (RF) to baseband.

8. The apparatus of claim 1, wherein the at least one processor digitally down converts the input sample stream for each frequency channel based on Coordinate Rotational Digital Computer (CORDIC) computation to generate the down converted sample stream for the frequency channel.

9. The apparatus of claim 8, wherein the at least one processor performs multiple iterations of CORDIC computation for each input sample in multiple pipeline stages to rotate the input sample by a particular phase.

10. The apparatus of claim 1, wherein for each frequency channel the at least one processor determines a center frequency of the frequency channel, estimates frequency error of the frequency channel, determines an instantaneous frequency of the frequency channel based on the center frequency and the estimated frequency error, and digitally down converts the input sample stream based on the instantaneous frequency for the frequency channel.

11. The apparatus of claim 1, wherein the at least one processor digitally filters the down converted sample stream for each frequency channel to pass a desired signal for the frequency channel and to attenuate undesired signals.

12. The apparatus of claim 1, wherein the at least one processor performs amplitude and phase equalization for the down converted sample stream for each frequency channel to compensate for amplitude and phase distortion due to filtering performed for the frequency channel.

13. The apparatus of claim 1, wherein the at least one processor performs sample rate conversion for the down converted sample stream for each frequency channel to generate the output sample stream for the frequency channel.

14. The apparatus of claim 1, wherein for each frequency channel the at least one processor determines a digital gain for the frequency channel based on received signal strength of the output sample stream for the frequency channel, and performs digital scaling for the output sample stream based on the digital gain.

15. The apparatus of claim 14, wherein the at least one processor performs the digital scaling in logarithm domain.

16. The apparatus of claim 1, wherein the at least one processor performs coarse automatic gain control (AGC) for the input sample stream for the multiple frequency channels, and performs fine AGC for the output sample stream for each frequency channel.

17. The apparatus of claim 1, wherein the at least one processor processes the output sample stream for each frequency channel with a RAKE receiver or an equalizer receiver based on a signal-to-noise (SNR) ratio of the output sample stream to generate symbol estimates for the frequency channel.

18. The apparatus of claim 1, wherein the multiple frequency channels correspond to multiple Code Division Multiple Access (CDMA) channels in a High Rate Packet Data (HRPD) system.

19. A method comprising:
digitizing an analog baseband signal comprising multiple signals on multiple frequency channels via a delta-sigma analog-to-digital conversion to generate an input sample stream, wherein the delta-sigma analog-to-digital conversion uses a variable reference voltage based on at least one of a bandwidth of the multiple frequency channels being received or a total number of the multiple signals being received;
detecting for saturation of the delta-sigma analog-to-digital conversion;
applying a first gain for the input sample stream if saturation of the delta-sigma analog-to-digital conversion is detected;
applying a second gain smaller than the first gain for the input sample stream if saturation of the delta-sigma analog-to-digital conversion is not detected;
digitally down converting the input sample stream for the multiple frequency channels to generate multiple down converted sample streams, one down converted sample stream for each frequency channel; and
digitally processing the down converted sample stream for each frequency channel to generate an output sample stream for the frequency channel.

20. The method of claim 19, further comprising:
generating multiple sample streams; and
performing error cancellation to combine the multiple sample streams to generate a combined sample stream, wherein the input sample stream is generated based on the combined sample stream.

21. The method of claim 19, further comprising:
estimating coarse direct current (DC) offset of the input sample stream;
estimating fine DC offset of the input sample stream; canceling the estimated fine DC offset from the input sample stream; and
providing the estimated coarse DC offset for analog DC offset cancellation.

22. The method of claim 19, further comprising:
performing I/Q mismatch compensation for the input sample stream to compensate for gain and phase mismatches of analog quadrature down conversion from radio frequency (RF) to baseband.

23. The method of claim 19, wherein the digitally down converting the input sample stream comprises digitally down converting the input sample stream for each frequency channel based on Coordinate Rotational Digital Computer (CORDIC) computation to generate the down converted sample stream for the frequency channel.

24. The method of claim 19, wherein the digitally processing the down converted sample stream for each frequency channel comprises digitally filtering the down converted sample stream for each frequency channel to pass a desired signal for the frequency channel and to attenuate undesired signals.

25. The method of claim 19, further comprising:
performing coarse automatic gain control (AGC) for the input sample stream for the multiple frequency channels; and
performing fine AGC for the output sample stream for each frequency channel.

26. The method of claim 19, further comprising:
processing the output sample stream for each frequency channel with a RAKE receiver or an equalizer receiver based on a signal-to-noise (SNR) ratio of the output sample stream to generate symbol estimates for the frequency channel.

27. An apparatus comprising:
means for digitizing an analog baseband signal comprising multiple signals on multiple frequency channels via a delta-sigma analog-to-digital conversion to generate an input sample stream, wherein the delta-sigma analog-to-digital conversion uses a variable reference voltage based on at least one of a bandwidth of the multiple frequency channels being received or a total number of the multiple signals being received;
means for detecting for saturation of the delta-sigma analog-to-digital conversion;
means for applying a first gain for the input sample stream if saturation of the delta-sigma analog-to-digital conversion is detected;
means for applying a second gain smaller than the first gain for the input sample stream if saturation of the delta-sigma analog-to-digital conversion is not detected;
means for digitally down converting the input sample stream for the multiple frequency channels to generate multiple down converted sample streams, one down converted sample stream for each frequency channel; and
means for digitally processing the down converted sample stream for each frequency channel to generate an output sample stream for the frequency channel.

28. The apparatus of claim 27, further comprising:
means for generating multiple sample streams; and
means for performing error cancellation to combine the multiple sample streams to generate a combined sample stream, wherein the input sample stream is generated based on the combined sample stream.

29. The apparatus of claim 27, further comprising:
means for estimating coarse direct current (DC) offset of the input sample stream;
means for estimating fine DC offset of the input sample stream;
means for canceling the estimated fine DC offset from the input sample stream; and
means for providing the estimated coarse DC offset for analog DC offset cancellation.

30. The apparatus of claim 27, further comprising:
means for performing I/Q mismatch compensation for the input sample stream to compensate for gain and phase mismatches of analog quadrature down conversion from radio frequency (RF) to baseband.

31. The apparatus of claim 27, wherein the digitally down converting the input sample stream comprises means for digitally down converting the input sample stream for each frequency channel based on Coordinate Rotational Digital Computer (CORDIC) computation to generate the down converted sample stream for the frequency channel.

32. The apparatus of claim 27, wherein the digitally processing the down converted sample stream for each frequency channel comprises means for digitally filtering the down converted sample stream for each frequency channel to pass a desired signal for the frequency channel and to attenuate undesired signals.

33. The apparatus of claim 27, further comprising:
means for performing coarse automatic gain control (AGC) for the input sample stream for the multiple frequency channels; and
means for performing fine AGC for the output sample stream for each frequency channel.

34. The apparatus of claim 27, further comprising:
means for processing the output sample stream for each frequency channel with a RAKE receiver or an equalizer receiver based on a signal-to-noise (SNR) ratio of the output sample stream to generate symbol estimates for the frequency channel.

35. A computer program product, comprising:
a non-transitory computer-readable medium comprising:
code for causing a computer to digitize an analog baseband signal comprising multiple signals on multiple frequency channels via a delta-sigma analog-to-digital conversion to generate an input sample stream, wherein the delta-sigma analog-to-digital conversion uses a variable reference voltage based on at least one of a bandwidth of the multiple frequency channels being received or a total number of the multiple signals being received;
code for causing the computer to detect for saturation of the delta-sigma analog-to-digital conversion;
code for causing the computer to apply a first gain for the input sample stream if saturation of the delta-sigma analog-to-digital conversion is detected;
code for causing the computer to apply a second gain smaller than the first gain for the input sample stream if saturation of the delta-sigma analog-to-digital conversion is not detected;
code for causing the computer to digitally down convert the input sample stream for the multiple frequency channels to generate multiple down converted sample streams, one down converted sample stream for each frequency channel; and
code for causing the computer to digitally process the down converted sample stream for each frequency channel to generate an output sample stream for the frequency channel.

36. An apparatus, comprising:
a mixer to receive an input radio frequency (RF) signal comprising multiple signals on multiple frequency channels, to down convert the input RF signal from RF to baseband, and to provide a down converted signal;
an amplifier to amplify the down converted signal and provide an amplified signal;

an analog filter to filter the amplified signal and provide an analog baseband signal comprising the multiple signals on the multiple frequency channels; and a delta-sigma analog-to-digital converter (ΔΣ ADC) to digitize the analog baseband signal, and to generate a sample stream for the multiple frequency channels, wherein the ΔΣ ADC has a variable reference voltage based on at least one of a bandwidth of the multiple frequency channels being received or a total number of the multiple signals being received, and wherein the amplifier has a first gain if saturation of the ΔΣ ADC for the analog baseband signal is detected and has a second gain higher than the first gain if saturation of the ΔΣ ADC is not detected.

37. The apparatus of claim 36, wherein the analog filter has a fixed bandwidth determined based on largest possible bandwidth of the multiple frequency channels.

38. The apparatus of claim 36, wherein the analog filter has a variable bandwidth determined based on bandwidth of the multiple frequency channels being received.

39. The apparatus of claim 36, wherein the multiple frequency channels correspond to multiple Code Division Multiple Access (CDMA) channels in a High Rate Packet Data (HRPD) system.

40. An apparatus comprising:
means for receiving an input radio frequency (RF) signal comprising multiple signals on multiple frequency channels;
means for down converting the input RF signal from RF to baseband to generate a down converted signal;
means for amplifying the down converted signal to generate an amplified signal;
means for filtering the amplified signal with an analog filter to generate an analog baseband signal comprising the multiple signals on the multiple frequency channels;
means for digitizing the analog baseband signal via a delta-sigma analog-to-digital conversion to generate a sample stream, wherein the delta-sigma analog-to-digital conversion uses a variable reference voltage based on at least one of a bandwidth of the multiple frequency channels being received or a total number of the multiple signals being received;
means for selecting a first gain if saturation of the delta-sigma analog-to-digital conversion for the analog baseband signal is detected; and
means for selecting a second gain higher than the first gain if saturation of the delta-sigma analog-to-digital conversion is not detected, and wherein the down converted signal is amplified based on the first or second gain.

41. The apparatus of claim 40, wherein the analog filter has a fixed bandwidth determined based on largest possible bandwidth of the multiple frequency channels.

42. A method comprising:
receiving an input radio frequency (RF) signal comprising multiple signals on multiple frequency channels;
down converting the input RF signal from RF to baseband to generate a down converted signal;
amplifying the down converted signal to generate an amplified signal;
filtering the amplified signal with an analog filter to generate an analog baseband signal comprising the multiple signals on the multiple frequency channels;
digitizing the analog baseband signal via a delta-sigma analog-to-digital conversion to generate a sample stream, wherein the delta-sigma analog-to-digital conversion uses a variable reference voltage based on at least one of a bandwidth of the multiple frequency channels being received or a total number of the multiple signals being received;
selecting a first gain if saturation of the delta-sigma analog-to-digital conversion for the analog baseband signal is detected; and
selecting a second gain higher than the first gain if saturation of the delta-sigma analog-to-digital conversion is not detected, and wherein the down converted signal is amplified based on the first or second gain.

43. An apparatus comprising:
a delta-sigma analog-to-digital converter (ΔΣ ADC) to digitize an analog baseband signal comprising multiple signals on multiple frequency channels, and to generate an input sample stream for the multiple frequency channels, wherein the ΔΣ ADC has a variable reference voltage based on at least one of a bandwidth of the multiple frequency channels being received or a total number of the multiple signals being received; and
at least one processor to digitally down convert the input sample stream for the multiple frequency channels to generate multiple down converted sample streams, one down converted sample stream for each frequency channel, and to digitally process the down converted sample stream for each frequency channel to generate an output sample stream for the frequency channel, wherein the at least one processor estimates coarse direct current (DC) offset with a first set of at least one DC accumulator, estimates fine DC offset with a second set of at least one DC accumulator, cancels the estimated fine DC offset from the input sample stream, and provides the estimated coarse DC offset for analog DC offset cancellation.

44. The apparatus of claim 43, wherein the ΔΣ ADC provides multiple sample streams, and wherein the at least one processor performs error cancellation to combine the multiple sample streams from the ΔΣ ADC.

* * * * *